United States Patent
Kato et al.

(10) Patent No.: US 7,081,776 B2
(45) Date of Patent: Jul. 25, 2006

(54) VOLTAGE DETECTION CIRCUIT, SEMICONDUCTOR DEVICE, METHOD FOR CONTROLLING VOLTAGE DETECTION CIRCUIT

(75) Inventors: Kenta Kato, Kasugai (JP); Satoru Kawamoto, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/057,143

(22) Filed: Feb. 15, 2005

(65) Prior Publication Data
US 2005/0134326 A1    Jun. 23, 2005

Related U.S. Application Data

(63) Continuation of application No. PCT/JP03/01971, filed on Feb. 24, 2003.

(51) Int. Cl.
*H03K 5/22* (2006.01)
*H03K 5/153* (2006.01)

(52) U.S. Cl. .................................... 327/77; 327/536
(58) Field of Classification Search ............... 327/77, 327/73, 143, 536
See application file for complete search history.

(56) References Cited

U.S. PATENT DOCUMENTS

| 5,168,174 | A | * | 12/1992 | Naso et al. | 327/540 |
| 5,282,170 | A | | 1/1994 | Van Buskirk et al. | 365/185.33 |
| 5,804,866 | A | * | 9/1998 | Aiello et al. | 257/577 |
| 6,791,395 | B1 | * | 9/2004 | Kim | 327/536 |

FOREIGN PATENT DOCUMENTS

| JP | 07-202664 | 8/1995 |
| JP | 2001-052489 | 2/2001 |
| JP | 2001-095234 | 4/2001 |
| JP | 2002-015571 | 1/2002 |
| JP | 2002-051538 | 2/2002 |

* cited by examiner

*Primary Examiner*—Quan Tra
(74) *Attorney, Agent, or Firm*—Arent Fox PLLC

(57) ABSTRACT

A voltage detection circuit for accurately detecting a voltage while suppressing the voltage fluctuation due to the off-leak current of a transistor. The voltage detection circuit includes first and second capacitors, first and second transistors, a comparator, and a control circuit. The capacitors are connected in series to generate a division voltage corresponding to a high voltage by the capacitors. The potential at a node between the first capacitor and the second capacitor is reset to ground potential when the transistors are activated. When the potential at the node reaches a predetermined potential, the first transistor is inactivated, and then the second transistor is inactivated.

12 Claims, 7 Drawing Sheets

US 7,081,776 B2

VOLTAGE DETECTION CIRCUIT, SEMICONDUCTOR DEVICE, METHOD FOR CONTROLLING VOLTAGE DETECTION CIRCUIT

CROSS-REFERENCE TO RELATED APPLICATIONS

This application is a continuation of, and claims priority from International PCT Application No. PCT/JP2003/001971, filed on Feb. 24, 2003, the contents being incorporated herein in entirety by reference.

BACKGROUND OF THE INVENTION

The present invention relates to a voltage detection circuit for detecting the output voltage of a voltage generation circuit mounted on a semiconductor device, a semiconductor device, and a method for controlling the voltage detection circuit.

There is a type of semiconductor device including a voltage generation circuit for generating an internal voltage differing from a power supply voltage supplied from an external device. A voltage detection circuit for detecting the output voltage of the voltage generation circuit is arranged on such a semiconductor device. More specifically, in the voltage detection circuit, division voltage, which corresponds to the output voltage of the voltage generation circuit, is compared with a reference voltage to detect whether the output voltage has reached a target voltage level based on the comparison result. A typical voltage detection circuit has a voltage dividing resistor, which functions as a device for generating the division voltage. However, current constantly flows through the voltage dividing resistor. Thus, for a semiconductor device requiring low power consumption (e.g., non-volatile memory), the voltage detection circuit uses a capacitor in place of the voltage dividing resistor. In such a voltage detection circuit, voltage must be accurately detected from the capacitance ratio.

FIG. 13 shows a conventional voltage detection circuit 31, and FIG. 14 shows an operation waveform chart of the voltage detection circuit 31.

The voltage detection circuit 31 is a circuit for detecting the output voltage $V_{PP}$ of a voltage generation circuit 32 and controls the voltage $V_{PP}$ so that it becomes equal to a target voltage value. The voltage detection circuit 31 includes two series-connected capacitors C1 and C2, a comparator 21, and an NMOS transistor Tn1.

The capacitors C1 and C2 divide the output voltage $V_{PP}$ of the voltage generation circuit 32. The division voltage div of the capacitors C1 and C2 (voltage at node N1 between the capacitors C1 and C2) is supplied to a non-inverting input terminal of the comparator 21, and a reference voltage Vref (e.g., 1.3 V) is supplied to an inverting input terminal of the comparator 21.

The drain of the NMOS transistor Tn1 is connected to the node N1 of the capacitors C1 and C2, and the source of the transistor Tn1 is connected to the ground GND. Further, a reset signal RST is provided to the gate of the NMOS transistor Tn1.

Referring to FIG. 14, when the voltage detection circuit 31 starts voltage detection, the NMOS transistor Tn1 is activated by the reset signal RST having a high level, and the division voltage div of the capacitors C1 and C2 is initialized to ground potential (0 V). At time t1, the reset signal RST is inverted to a low level and the transistor Tn1 is inactivated. Thus, the node N1 of the capacitors C1 and C2 enters a floating state. After time t1, the division voltage div of the capacitors C1 and C2 changes in accordance with the output voltage $V_{PP}$. That is, when the output voltage $V_{PP}$ increases by the boosting operation of the voltage generation circuit 32, the division voltage div also increases at a changing degree that is in accordance with the capacitance ratio of the capacitors C1 and C2.

The comparator 21 compares the division voltage div and the reference voltage Vref, and outputs an output signal COM having a voltage level that is in accordance with the comparison result. That is, the comparator 21 outputs the output signal COM at a low level when the division voltage div is lower than the reference voltage Vref. Further, the comparator 21 outputs the output signal COM at a high level when the division voltage div is greater than or equal to the reference voltage Vref. The output voltage of the voltage generation circuit 32 is controlled, based on the output signal COM, so that it becomes equal to the target voltage value.

The voltage detection circuit performing voltage detection based on the capacitance ratio is disclosed in, for example, Japanese Laid-Open Patent Publication No. 2002-51538.

In a non-volatile semiconductor memory device, the writing and erasing of data is carried out utilizing semiconductor characteristics, such as the break down characteristic and the tunneling characteristic. More specifically, in a non-volatile memory, the voltage generation circuit generates voltage (e.g., 10 V), which is higher than the power supply voltage (e.g., 3 V), or negative voltage (e.g., −10 V). The voltage generation circuit then applies the high voltage or negative voltage to a word line to write or erase data.

In a non-volatile memory, a voltage detection circuit 31 shown in FIG. 13 is used to control the output voltage of the voltage generation circuit at a predetermined voltage (high voltage=10 V, negative voltage=−10 V). The voltage detection circuit 31 performs voltage detection based on the capacitance ratio. Thus, the voltage detection circuit 31 consumes less power than a voltage detection circuit that performs voltage detection based on the resistance ratio.

However, tailing current (referred to as sub-threshold current or off leak current) flows through the NMOS transistor Tn1, which initializes the division voltage div in the voltage detection circuit 31. This fluctuates the output voltage $V_{PP}$.

More specifically, when the output voltage $V_{PP}$ of the voltage generation circuit 32 reaches the target voltage value, the division voltage div of the voltage detection circuit 31 becomes equal to the reference voltage Vref (1.3 V). In this state, the transistor Tn1 is inactivated by the reset signal RST having a low level. However, the division voltage div, which is equal to the reference voltage Vref, is applied between the source and drain. Thus, there is a flow of a slight leak current. In this manner, when off leak current flows through the transistor Tn1, the division voltage div becomes lower than the reference voltage Vref. In this case, the voltage generation circuit 32 continues the boosting operation regardless even though the output voltage $V_{PP}$ has reached the target voltage value. Thus, the output voltage $V_{PP}$ becomes higher than necessary.

Such a phenomenon is not problematic as long as the operation time for voltage detection with the voltage detection circuit 31 is relatively short with respect to the decrease in the output voltage $V_{PP}$ caused by the off leak current. However, the write operation or the erase operation of data in the non-volatile memory requires time (several tens of milliseconds) that is several thousand times longer than the read operation time (several tens of nanoseconds). Thus, in a semiconductor device requiring a long period of time for the voltage detection operation as in the non-volatile memory, the output voltage $V_{PP}$ of the voltage generation circuit 32 becomes higher than necessary due to the off leak current of the transistor Tn1.

It is an object of the present invention to provide a voltage detection circuit, a semiconductor device, and a method for controlling the voltage detection circuit that suppresses voltage fluctuation caused by off leak current of a transistor to accurately perform voltage detection.

SUMMARY OF THE INVENTION

One aspect of the present invention is a voltage detection circuit for use with a voltage generation circuit for detecting output voltage of the voltage generation circuit. The voltage detection circuit includes a first capacitor and a second capacitor, connected in series, for receiving the output voltage to generate a division voltage in accordance with the output voltage. A first transistor is connected to a first node between the first capacitor and the second capacitor. A second transistor is connected in series to the first transistor. The first and second transistors are activated to initialize potential at the first node to an initial potential. A control circuit, connected to the first transistor, generates a first control signal to inactivate the first transistor later than the second transistor and after the initialization of the potential at the first node.

Another aspect of the present invention is a voltage detection circuit for use with to a voltage generation circuit for detecting output voltage of the voltage generation circuit. The voltage detection circuit includes a first capacitor and a second capacitor, connected in series, for receiving the output voltage to generate a division voltage in accordance with the output voltage. A transistor, connected to a node between the first capacitor and the second capacitor, initializes potential at the node to an initial potential. A control circuit, connected to the transistor, generates a control signal having a negative potential that is lower than the initial potential when the potential at the node is initialized and activates the transistor with the control signal.

A further aspect of the present invention is a voltage detection circuit for use with a voltage generation circuit for detecting negative voltage generated in the voltage generation circuit. The voltage detection circuit includes a first capacitor and a second capacitor, connected in series, for receiving the negative voltage to generate a division voltage in accordance with the negative voltage. A transistor, connected to a node between the first capacitor and the second capacitor, initializes potential at the node to an initial potential. The transistor includes a gate for receiving a control signal, a source for receiving the initial potential, and a drain connected to the node.

Another aspect of the present invention is a voltage detection circuit for use with a voltage generation circuit for detecting output voltage of the voltage generation circuit. The voltage detection circuit includes a first capacitor and a second capacitor, connected in series, for receiving the output voltage to generate a division voltage in accordance with the output voltage. A transistor, connected to a node between the first capacitor and the second capacitor, initializes potential at the node to an initial potential. The transistor includes a gate for receiving a control signal, a source for receiving an inverted signal of the control signal, and a drain connected to the node.

A further aspect of the present invention is a method for controlling a voltage detection circuit, arranged in a semiconductor device including a voltage generation circuit, for detecting voltage generated by the voltage generation circuit. The voltage detection circuit includes a first capacitor and a second capacitor, connected in series, a first transistor connected to a first node between the first capacitor and the second capacitor, and a second transistor connected in series to the first transistor. The method includes the steps of generating a division voltage in accordance with an output voltage of the voltage generation circuit using the first and second capacitors, activating the first transistor and the second transistor to initialize potential at the first node to an initial potential, inactivating only the second transistor after the potential at the first node is initialized and equalizing the potential at a second node between the first transistor and the second transistor with the potential at the first node, and inactivating the first transistor when the potential at the first node reaches a predetermined potential in accordance with the output voltage of the voltage generation circuit.

Another aspect of the present invention is a method for controlling a voltage detection circuit, arranged in a semiconductor device including a voltage generation circuit, for detecting voltage generated by the voltage generation circuit. The voltage detection circuit includes a first capacitor and a second capacitor, connected in series, and a transistor, connected to a node between the first capacitor and the second capacitor. The transistor includes a gate. The method includes generating a division voltage in accordance with an output voltage of the voltage generation circuit with the first and second capacitors. The method further includes generating a control signal having a negative potential that is lower than the initial potential, and supplying the gate of the transistor with the control signal to activating the transistor and to initialize potential at the node to an initial potential.

A further aspect of the present invention is a method for controlling a voltage detection circuit, arranged in a semiconductor device including a voltage generation circuit, for detecting voltage generated by the voltage generation circuit. The voltage detection circuit includes a first capacitor and a second capacitor, connected in series, and a transistor, connected to a node between the first capacitor and the second capacitor. The transistor includes a gate. The method comprises the steps of generating a division voltage in accordance with an output voltage of the voltage generation circuit with the first and second capacitors, activating the transistor and initializing the potential at the node to an initial potential, and supplying the gate of the transistor with a potential higher than the initial potential to inactivate the transistor after initializing the potential at the node.

Another aspect of the present invention is a method for controlling a voltage detection circuit, arranged in a semiconductor device including a voltage generation circuit, for detecting voltage generated by the voltage generation circuit. The voltage detection circuit includes a first capacitor and a second capacitor, connected in series, and a transistor, connected to a node between the first capacitor and the second capacitor. The method includes the steps of generating a division voltage in accordance with an output voltage of the voltage generation circuit with the first and second capacitors, activating the transistor and initializing the potential at the node to an initial potential, and supplying a source of the transistor with a potential greater than or equal to the potential at the node after initializing the potential at the node when the transistor is inactivated.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A semiconductor memory device 11 according to a first embodiment of the present invention will now be described with reference to the drawings.

Figure 1:
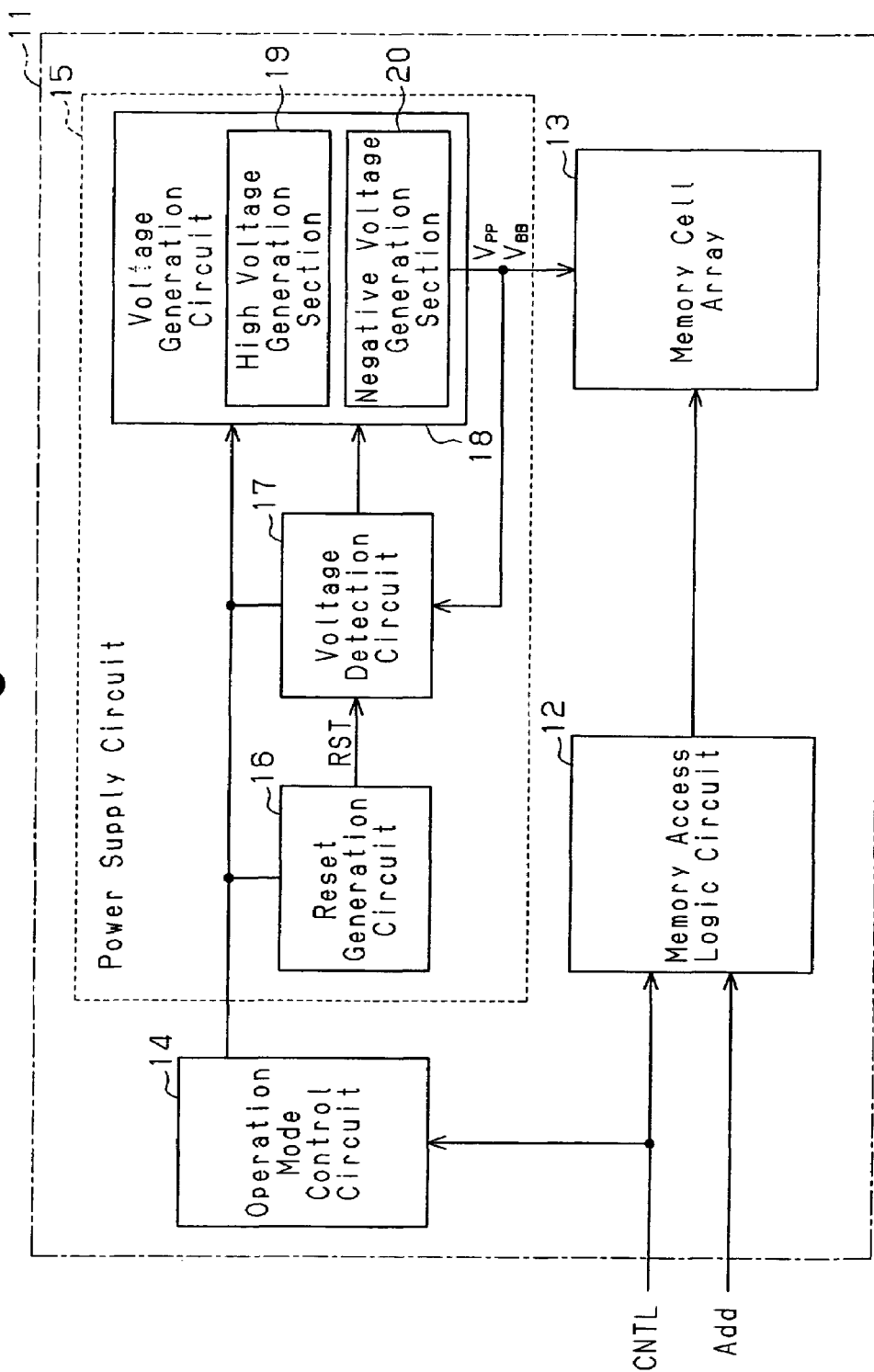
FIG. 1 is a schematic block diagram showing a semiconductor device according to a first embodiment of the present invention.

FIG. 1 is a schematic block diagram of the semiconductor memory device 11. The semiconductor memory device 11, which is a non-volatile memory, includes a memory access logic circuit 12, a memory cell array 13, an operation mode control circuit 14, and a power supply circuit 15. Further, the power supply circuit 15 includes a reset generation circuit 16, a voltage detection circuit 17, and a voltage generation circuit 18.

In the semiconductor memory device 11, a control signal CNTL and an address signal Add are provided from an external device to the memory access logic circuit 12. The control signal CNTL is also provided to the operation mode control circuit 14.

The memory access logic circuit 12 includes a latch circuit for latching the address signal Add and a decoder for decoding the address signal Add. One of a plurality of memory cells arranged in the memory cell array 13 is accessed in accordance with the decoded signal generated by the logic circuit 12. In the present embodiment, the memory cells arranged in the memory cell array 13 are non-volatile memory cells.

The operation mode control circuit 14 controls the power supply circuit 15 based on the control signal CTNL. Types of control signal CNTL includes signals such as a read command, a write command, and an erase command.

If the provided control signal CNTL is the write command, the operation mode control circuit 14 activates a high voltage generation section 19 in the voltage generation circuit 18 in response to the write command. In this state, high voltage $V_{PP}$ is generated in the high voltage generation section 19 of the voltage generation circuit 18. The high voltage $V_{PP}$ is supplied to the memory cell array 13.

If the control signal CNTL is the erase command, the operation mode control circuit 14 activates a negative voltage generation section 20 in the voltage generation circuit 18 in response to the erase command. In this state, negative voltage $V_{BB}$ is generated in the negative voltage generation section 20 of the voltage generation circuit 18. The negative voltage $V_{BB}$ is supplied to the memory cell array 13.

In the memory cell array 13, the high voltage $V_{PP}$ or the negative voltage $V_{BB}$ from the voltage generation circuit 18 is supplied to a word line, a bit line, or a well layer, which configures a MOS transistor, that are connected to the memory cell. The writing or erasing of data is performed in a memory cell when supplied with high voltage $V_{PP}$ or negative voltage $V_{BB}$.

Further, in the semiconductor memory device 11, when starting the writing or erasing of data, the reset signal RST is provided from the reset generation circuit 16 to the voltage detection circuit 17 prior to activation of the circuits of the high voltage generation section 19 or the negative voltage generation section 20 in the voltage generation circuit 18. The voltage detection operation of the voltage detection circuit 17 is initialized by the reset signal RST.

Figure 2:
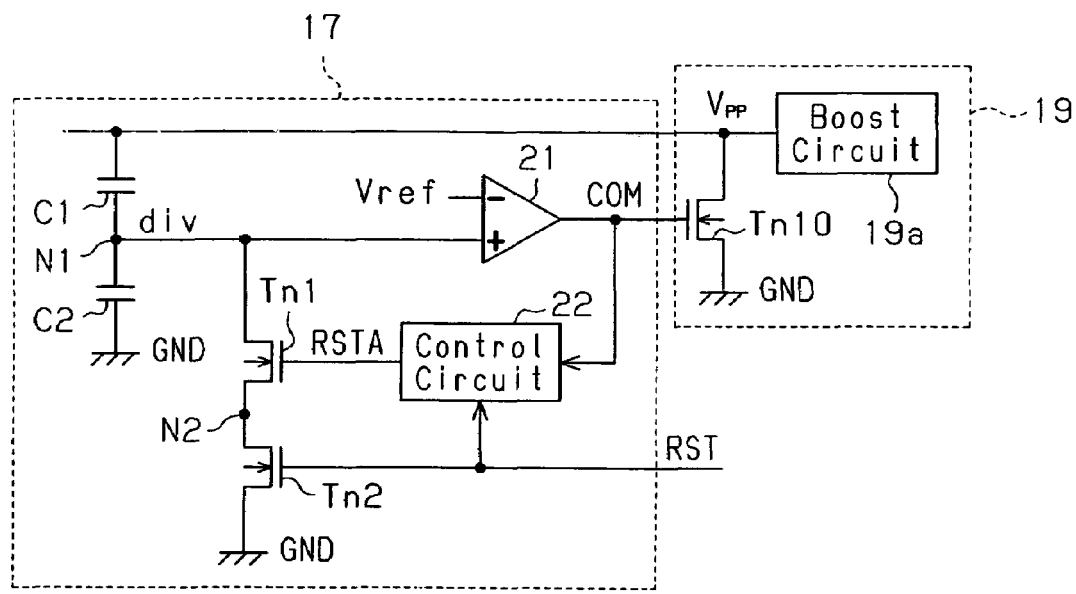
FIG. 2 is a schematic circuit diagram of a voltage detection circuit in the semiconductor device of FIG. 1.

FIG. 2 shows the voltage detection circuit 17. FIG. 2 shows a circuit for detecting the high voltage $V_{PP}$ but does not show a circuit for detecting the negative voltage $V_{BB}$.

For detection of the high voltage $V_{PP}$ generated in the high voltage generation section 19, the voltage detection circuit 17 includes capacitors C1 and C2, which function as first and second capacitors, a comparator 21, which functions as a determination circuit, a control circuit 22, and NMOS transistors Tn1 and Tn2, which functions as first and second transistors. The high voltage generation section 19 includes a boost circuit 19a and an NMOS transistor Tn10.

Figure 13:
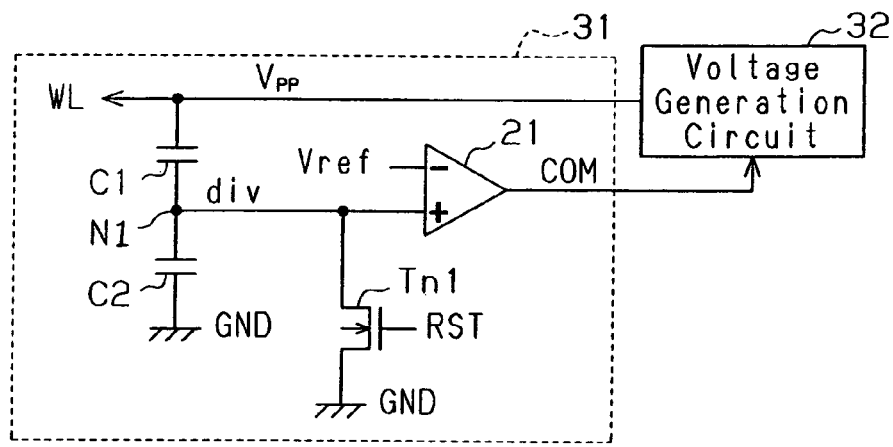
FIG. 13 is a schematic circuit diagram of a voltage detection circuit in the prior art.
Figure 14:
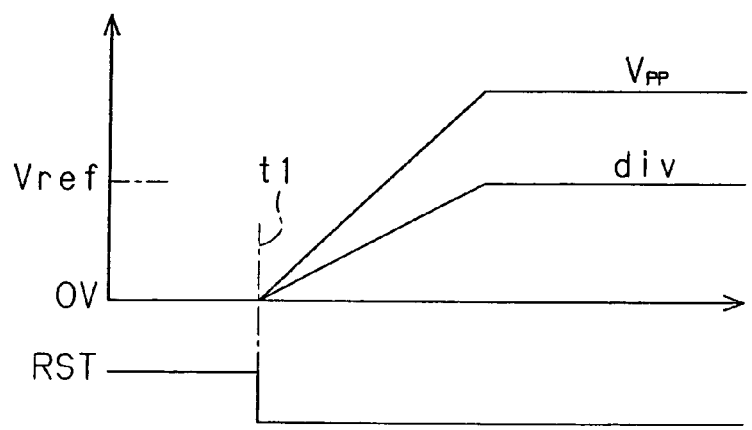
FIG. 14 is an operation waveform chart of the voltage detection circuit of FIG. 13.

In the voltage detection circuit 17, the configuration of the capacitors C1 and C2 and the comparator 21 is the same as the configuration of the conventional voltage detection circuit 31 shown in FIG. 13. That is, the capacitors C1 and C2 are connected in series, and the high voltage $V_{PP}$, which is the output voltage of the high voltage generation section 19, is divided by the capacitors C1 and C2. The comparator 21 compares the division voltage div of the capacitors C1 and C2 (voltage at the node N1 of each capacitor C1, C2) with the reference voltage Vref (e.g., 1.3 V) to generate an output signal COM having a potential level that is in accordance with the comparison result.

The output signal COM of the comparator 21 is provided to the gate of the NMOS transistor Tn10 in the high voltage generation section 19. The drain of the NMOS transistor Tn10 is connected to an output terminal of the boost circuit 19a, and the source of the NMOS transistor Tn10 is connected to the ground GND. The NMOS transistor Tn10 is activated and inactivated by the output signal COM of the comparator 21 so that the high voltage $V_{PP}$ supplied from the high voltage generation section 19 becomes equal to the target voltage value.

More specifically, when the boosting operation of the boost circuit 19a causes the high voltage $V_{PP}$ to become greater than or equal to the target voltage value (e.g., 10 V), the division voltage div of the capacitors C1 and C2 becomes greater than or equal to the reference voltage Vref (e.g., 1.3 V), and the voltage level of the output signal COM from the comparator 21 becomes high. The NMOS transistor Tn10 is activated by the output signal COM of the comparator 21 so that the high voltage $V_{PP}$ becomes equal to the target voltage value.

Two NMOS transistors Tn1 and Tn2 are arranged in the voltage detection circuit 17 of the present embodiment as devices for initializing the division voltage div when starting voltage detection. The NMOS transistors Tn1 and Tn2 are connected in series between the ground GND and the node N1 (first node) of the capacitors C1 and C2.

A reset signal RST (first control signal) from the reset generation circuit 16 is provided to the gate of the NMOS transistor Tn2, and a reset signal (second control signal) RSTA of the control circuit 22 is provided to the gate of the NMOS transistor Tn1. In the control circuit 22, the reset signal RSTA is generated based on the reset signal RST and the output signal COM of the comparator 21.

Figure 3:
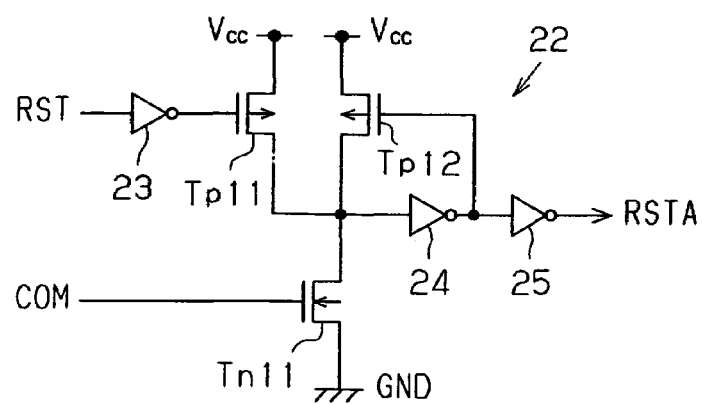
FIG. 3 is a schematic circuit diagram of a control circuit of FIG. 2.

FIG. 3 shows a circuit diagram of the control circuit 22.

The control circuit 22 is configured by PMOS transistors Tp11, Tp12, an NMOS transistor Tn11, and inverter circuits 23, 24, 25. The reset signal RST from the reset generation circuit 16 is provided to the gate of the PMOS transistor Tp11 via the inverter circuit 23, and the output signal COM of the comparator 21 is provided to the gate of the NMOS transistor Tn11.

The PMOS transistor Tp11 and the NMOS transistor Tn11 are connected in series, the source of the PMOS transistor Tp11 is connected to a power supply $V_{CC}$, and the source of the NMOS transistor Tn11 is connected to the ground GND. Further, the drain of the PMOS transistor Tp12 is connected to a node between the transistors Tp11 and Tn11, and the source of the transistor Tp12 is connected to the power supply $V_{CC}$.

A node between the transistors Tp11, Tp12, and Tn11 is connected to the gate of the PMOS transistor Tp12 via the inverter circuit 24. The potential level at the node between the transistors Tp11, Tp12, and Tn11 is inverted by the inverter circuit 24 and provided to the gate of the PMOS transistor Tp12. Further, the potential level at the node between the transistors Tp11, Tp12, and Tn11 is output as the reset signal RSTA via the two inverter circuits 24 and 25.

The operation of the voltage detection circuit 17 in the present embodiment will now be described.

Figure 4:
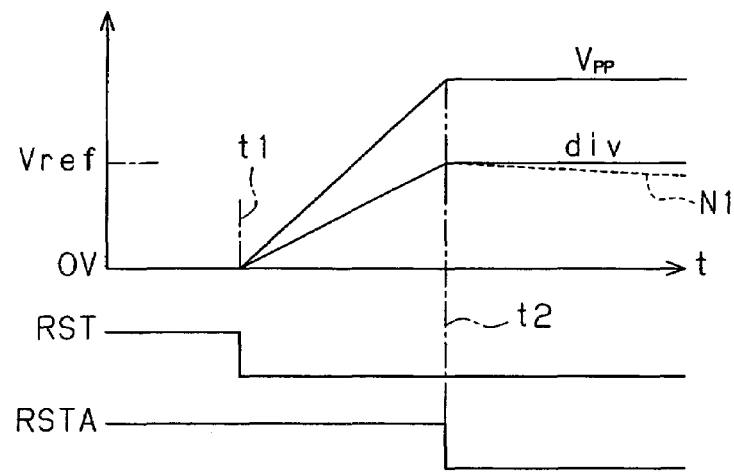
FIG. 4 is an operation waveform chart of a voltage detection circuit of FIG. 2.

As shown in FIG. 4, when starting detection of high voltage $V_{PP}$, the reset signal RST having a high level is output from the reset generation circuit 16. In this state, the output signal COM of the comparator 21 has a low level. Thus, the PMOS transistor Tp11 is activated and the NMOS transistor Tn11 is inactivated in the control circuit 22. Further, the reset signal RSTA having a high level is output from the control circuit 22.

Therefore, in the voltage detection circuit 17, the NMOS transistors Tn1 and Tn2 are each activated by the high reset signals RST and RSTA. As a result, the division voltage div of the capacitors C1 and C2 is initialized to the ground potential (0 V), which serves as an initial potential.

At time t1, when the reset signal RST shifts to a low level, the PMOS transistor Tp11 in the control circuit 22 is inactivated. In this state, the PMOS transistor Tp12 is activated and the NMOS transistor Tn11 is inactivated. Thus, the reset signal RSTA output from the control circuit 22 has a high level.

Accordingly, in the voltage detection circuit 17, the transistor Tn1 is activated by the high reset signal RSTA, and the transistor Tn2 is inactivated by the low reset signal RST. Since the transistor Tn2 is inactivated, the node N1 of the capacitors C1 and C2 enters a floating state, and the division voltage div of the capacitors C1 and C2 changes in accordance with the high voltage $V_{PP}$.

Further, at time t1, the boost circuit 19a of the high voltage generation section 19 is activated. This starts the boosting operation of the boost circuit 19a. Thus, after time t1, the high voltage $V_{PP}$, or the output voltage of the boost circuit 19a, gradually increases. The division voltage div of the capacitors C1 and C2 also increases in accordance with the changing degree of the capacitance ratio.

Between times t1 and t2 (period in which the division voltage div increases), the potential level at a node N2 (second node) of the transistors Tn1 and Tn2 is equal to the division voltage div since the transistor Tn1 is activated.

At time t2, when the high voltage $V_{PP}$ reaches the target voltage value and the division voltage div becomes equal to the reference voltage Vref, the output signal COM of the comparator 21 shifts to a high level from the low level. In this state, in the control circuit 22, the NMOS transistor Tn11 is activated by the high output signal COM. Thus, the reset signal RSTA output from the control circuit 22 shifts from the high level to the low level.

The transistor Tn1 is inactivated by the low reset signal RSTA. Immediately after time t2, off leak current subtly flows via the NMOS transistor Tn1 since the division voltage div and the potential level at the node N2 of the transistors Tn1 and Tn2 are substantially the same. Further, voltage substantially equal to the division voltage div is applied between the source and drain of the NMOS transistor Tn2. Thus, off leak current corresponding to such voltage flows through the NMOS transistor Tn2. This gradually decreases the potential level at the node N2 of the transistors Tn1 and Tn2.

In the voltage detection circuit 17 of the present embodiment, off leak current does not flow through the NMOS transistor Tn1 until the potential level at the node N2 of the transistors Tn1 and Tn2 decreases. This ensures sufficient time until the division voltage div decreases the off leak current (high voltage $V_{PP}$ deviates from the target voltage value). More specifically, the division voltage div is prevented from being decreased by the off leak current during a voltage application period in which high voltage $V_{PP}$ must be applied to write data. This improves the reliability of data writing in the semiconductor memory device 11.

The voltage detection circuit 17 of the first embodiment has the advantages described below.

(1) The two NMOS transistors Tn1 and Tn2 are connected in series to the node N1 of the capacitors C1 and C2. When each of the transistors Tn1 and Tn2 is activated, the division voltage div (voltage of node N1) is reset to ground potential. Subsequently, the ground side transistor Tn2 is inactivated, and the division voltage div is increased in accordance with the high voltage $V_{PP}$. When the division voltage div reaches the reference voltage Vref, the transistor Tn1 is inactivated. Thus, off leak current does not flow through the NMOS transistor Tn1 until the potential level at the node N2 of the transistor Tn1 and Tn2 is lowered by the off leak current of the transistor Tn2. This ensures sufficient time before the division voltage div decreases and the high voltage $V_{PP}$ deviates from the target voltage value. Therefore, the voltage detection circuit 17 accurately performs voltage detection during the high voltage application period in the semiconductor memory device 11.

(2) In the control circuit 22, the reset signal RSTA for controlling the transistor Tn1 is generated based on the reset signal RST for controlling the transistor Tn2 and the output signal COM of the comparator 21. More specifically, in the control circuit 22, the reset signal RSTA is inverted from the high level to the low level at a timing (time t2 in FIG. 4) when the high voltage $V_{PP}$ reaches the target voltage value and the output signal COM becomes high. Thus, the potential of the node N2 of the transistors Tn1 and Tn2 becomes equal to the reference voltage Vref. This is preferable for delaying the timing in which off leak current flows through the transistor Tn1 (time when the division voltage div starts to decrease).

(3) In the semiconductor memory device 11, an appropriate high voltage $V_{PP}$ is generated when writing data. This improves the reliability of data writing.

A second embodiment of the present invention will now be described with reference to FIGS. 5 to 7. In the present embodiment, like or same reference numerals are given to those components that are the same as the corresponding components of the first embodiment and such components will not be described. Parts differing from the first embodiment will now be discussed.

Figure 5:
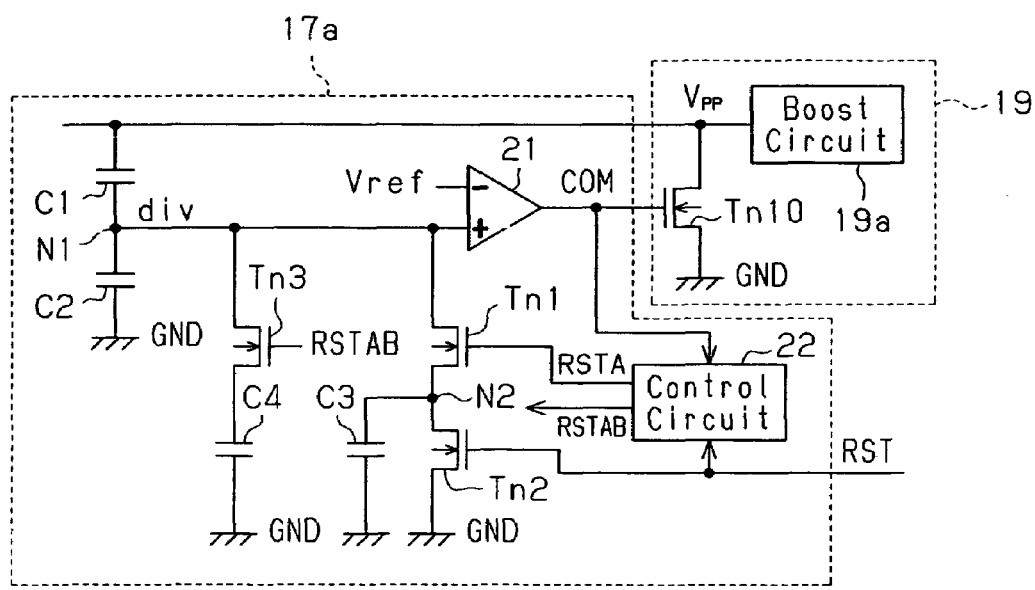
FIG. 5 is a schematic circuit diagram of a voltage detection circuit according to a second embodiment of the present invention.

As shown in FIG. 5, in the voltage detection circuit 17a of the present embodiment, the node N2 of the transistors Tn1 and Tn2 is connected to the ground GND via a capacitor C3, which functions as a third capacitor. The drain of a NMOS transistor Tn3, which functions as a third transistor, is connected to the node N1 of the capacitors C1 and C2. The source of the NMOS transistor Tn3 is connected to the ground GND via a capacitor C4, which functions as a fourth capacitor. The reset signal RSTAB is provided to the gate of the NMOS transistor Tn3.

In the voltage detection circuit 17a, the addition of the capacitor C3 to the node N2 of the transistors Tn1 and Tn2 prevents the division voltage div from being decreased by off leak current. The capacitor C3 and the capacitor C4 have the same capacitance. By activating the transistor Tn3 when inactivating the transistor Tn1, the capacitor C4 becomes connected to the node N1 in place of the capacitor C3. This prevents fluctuation of the division voltage div at the node N1.

Figure 6:
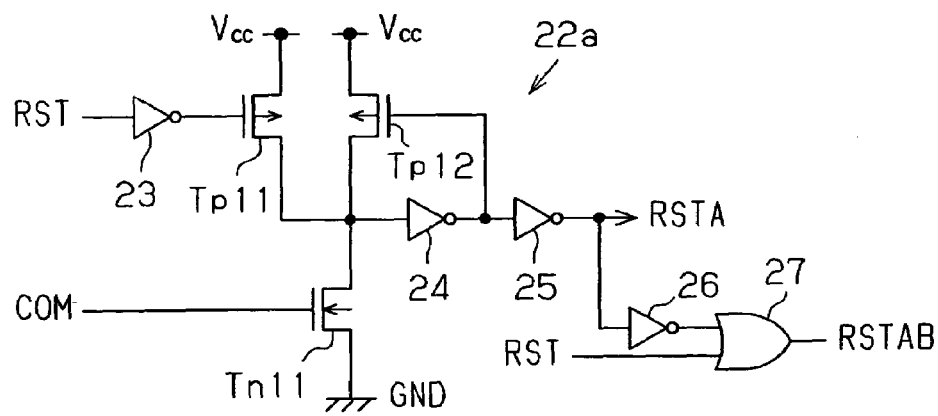
FIG. 6 is a schematic circuit diagram of a control circuit of the second embodiment of the present invention.

FIG. 6 shows a control circuit 22a of the present embodiment. The control circuit 22a is configured by adding an inverter circuit 26 and an OR circuit 27 to the control circuit 22 of FIG. 3.

More specifically, the reset signal RSTA output from the inverter circuit 25 is provided to a first input terminal of the OR circuit 27 via the inverter circuit 26. The reset signal RST is provided to a second input terminal of the OR circuit 27. The reset signal RSTAB is output from the output terminal of the OR circuit 27.

Figure 7:
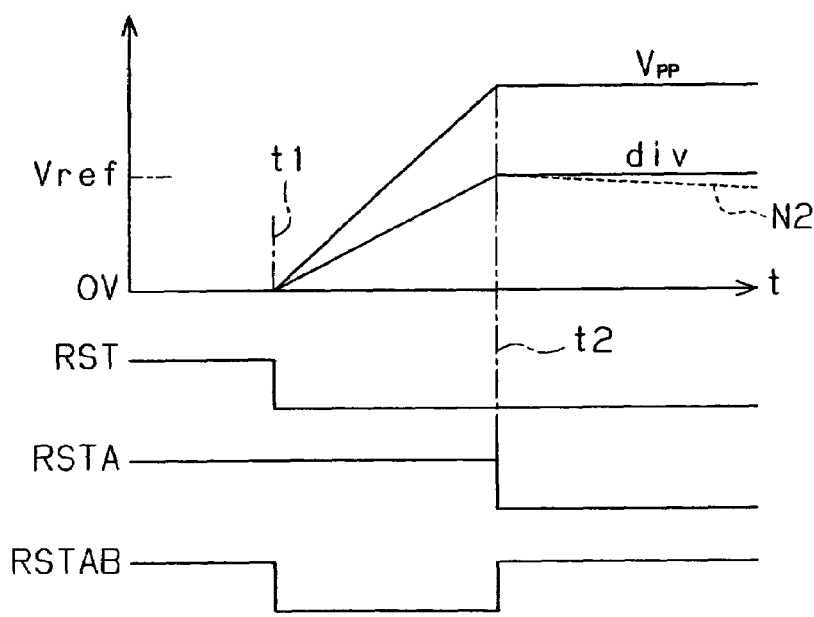
FIG. 7 is an operation waveform chart of the voltage detection circuit of FIG. 5.

Therefore, as shown in FIG. 7, when the reset signals RST and RSTA are high prior to time t1, the reset signal RSTAB is also high. In this case, in the voltage detection circuit 17a, the transistors Tn1, Tn2, and Tn3 are all activated and the division voltage div is initialized.

Between time t1 to t2, the reset signal RST is low, the reset signal RSTA is high, and the reset signal RSTAB is low. Further, at time t2, the reset signal RSTAB shifts to a high level as the reset signal RSTA shifts to a low level.

After time t1 (after voltage detection is started), the reset signal RSTAB is a signal in which the logic level is inverted with respect to the reset signal RSTA (inverted control signal). The transistor Tn1 and the transistor Tn3 are activated and inactivated based on the reset signal RSTA and the reset signal RSTAB to alternately connect the capacitor C3 and the capacitor C4 to the node N1.

At time t2, when the division voltage div becomes equal to the reference voltage Vref, the following relational expression is satisfied.

$C1 \times (V_{PP} - Vref) = (C2 + C3) \times Vref$

Subsequent to time t2, when the capacitor C4 is connected in place of the capacitor C3, the following relational expression is satisfied.

$C1 \times (V_{PP} - Vref) = (C2 + C4) \times Vref$

The following expressions are satisfied when obtaining the high voltage $V_{PP}$ form the above relational expressions.

$V_{PP} = (C2 + C3) \times Vref/C1 + Vref$ $V_{PP} = (C2 + C4) \times Vref/C1 + Vref$ The second embodiment of the present invention has the advantages described below.

(1) The capacitor C3 is added to the node N2 of the transistor Tn1 and the transistor Tn2. This slows the decrease of the potential level at the node N2 caused by off leak current of the transistor Tn2, and delays the time when off leak current of the transistor Tn1 starts to flow and decrease the division voltage div.

(2) When inactivating the transistor Tn1 and disconnecting the capacitor C3 from the node N1 of the capacitors C1 and C2 (time t2), the transistor Tn3 is activated and the capacitor C4 is connected to the node N1. This prevents fluctuation of the division voltage div at the node N1.

A third embodiment of the present invention will now be described with reference to FIG. 8 and FIG. 9. In the present embodiment, like or same reference numerals are given to those components that are the same as the corresponding components of the first embodiment.

Figure 8:
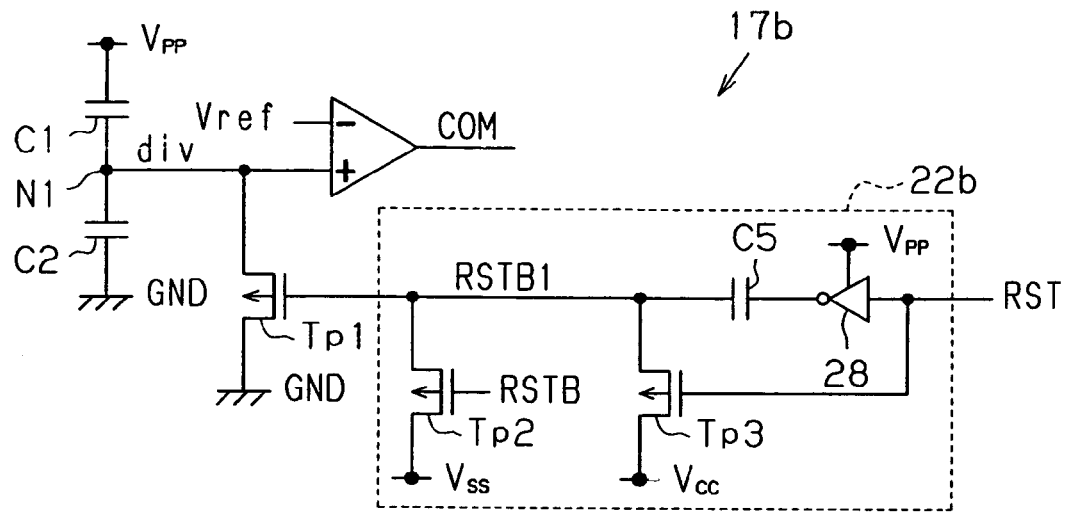
FIG. 8 is a circuit diagram of a voltage detection circuit according to a third embodiment of the present invention.

As shown in FIG. 8, in a voltage detection circuit 17b of the present embodiment, a PMOS transistor Tp1 is arranged as a device for initializing the division voltage div of the capacitors C1 and C2. The division voltage div is supplied to the source of the PMOS transistor Tp1. The drain of the PMOS transistor Tp1 is connected to the ground GND. Further, a reset signal RSTB1 (control signal) from the control circuit 22b is provided to the gate of the PMOS transistor Tp1.

The control circuit 22b includes PMOS transistors Tp2 and Tp3, a capacitor C5, and an inverter circuit 28. In the control circuit 22b, the reset signal RST is provided to the inverter circuit 28. The output signal of the inverter circuit 28 is provided to the gate of the PMOS transistor Tp1 via the capacitor C5. The high voltage $V_{PP}$ is supplied to the power supply terminal of the inverter circuit 28. Therefore, the output signal of the inverter circuit 28 has a larger amplitude than that of the reset signal RST.

The source of the PMOS transistor Tp2 is connected between the gate of the PMOS transistor Tp1 and the capacitor C5, and the drain of the PMOS transistor Tp2 is connected to the low potential power supply $V_{SS}$. The inverted signal RSTB, in which the logic level of the reset signal RST is inverted, is provided to the gate of the PMOS transistor Tp2.

Further, the drain of the PMOS transistor Tp3 is connected between the gate of the PMOS transistor Tp1 and the capacitor C5, and the source of the PMOS transistor Tp3 is connected to the high potential power supply $V_{CC}$. The reset signal RST is provided to the gate of the PMOS transistor Tp3.

The PMOS transistor Tp2 functions as a discharge device for discharging the potential at the gate of the PMOS transistor Tp1 to a low potential level. The PMOS transistor Tp3 is a charge device for charging the potential at the gate of the PMOS transistor Tp1 to a high potential level.

Figure 9:
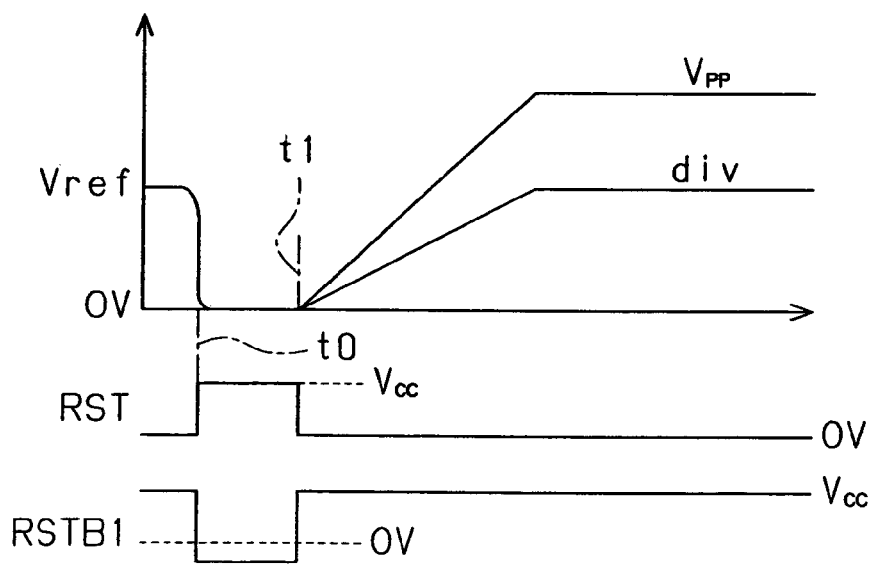
FIG. 9 is an operation waveform chart of the voltage detection circuit of FIG. 8.

As shown in FIG. 9, the reset signal RST shifts from a low level to a high level immediately before detection of the high voltage $V_{PP}$ is started (time t0). In this state, the PMOS transistor Tp2 is activated and the PMOS transistor Tp3 is inactivated. Thus, the potential level (reset signal RSTB1) at the gate of the PMOS transistor Tp1 is discharged from the high potential power supply $V_{CC}$ to the potential level of the low potential power supply $V_{SS}$, and shifted to the negative potential level by the coupling of the capacitor C5. By activating the transistor Tp1 with the reset signal RSTB1 having a negative potential level, the potential level for the division voltage div of the capacitors C1 and C2 is initialized to the ground potential (0 V).

When the reset signal RST is inverted from the high level to the low level at time t1, the PMOS transistor Tp2 is inactivated and the PMOS transistor Tp3 is activated. Thus, the gate of the PMOS transistor Tp1 (reset signal RSTB1) is charged to the potential level of the high potential power supply $V_{CC}$ from the negative potential. The PMOS transistor Tp1 is completely cut off by the reset signal RSTB1. In this state, the reset signal RSTB1 has a voltage higher than the division voltage div, and the PMOS transistor Tp1 is inactivated by the signal RSTB1. Thus, off leak current becomes subtle such that it can be ignored.

The voltage detection circuit 17b of the third embodiment has the advantages described below.

(1) The PMOS transistor Tp1 is used as a device for initializing the division voltage div of the capacitors C1 and C2. Thus, off leak current is reduced by about 1/10 compared to when using an NMOS transistor. This suppresses fluctuation of the division voltage div and enables the voltage detection circuit 17b to accurately perform voltage detection.

(2) When resetting the division voltage div of the capacitors C1 and C2 to the ground potential (0 V) with the PMOS transistor Tp1, the division voltage div cannot be completely reset to the ground potential (0 V) due to the threshold value characteristic of the transistor Tp1 even if the gate of the transistor Tp1 has the ground potential. In the present embodiment, the control circuit 22b is configured to generate a negative voltage lower than the ground potential by performing self-boosting. Further, the transistor Tp1 is activated by the reset signal RSTB1, which has negative voltage, output from the control circuit 22b. Accordingly, the division voltage div is reset to the ground potential (0 V), which is the ideal initial potential.

A fourth embodiment of the present invention will now be described.

Figure 10:
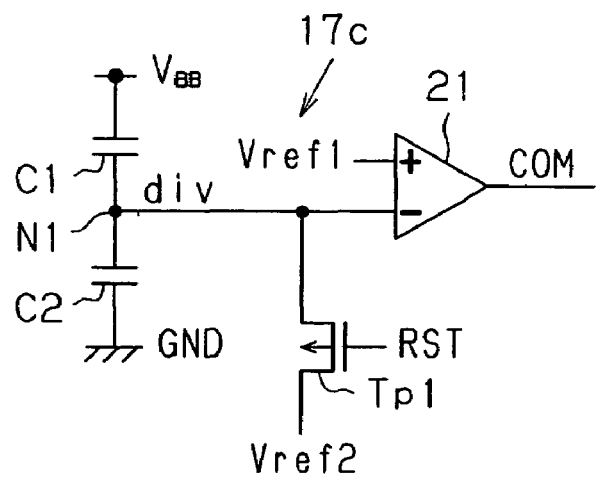
FIG. 10 is a circuit diagram of a voltage detection circuit according to a fourth embodiment of the present invention.
Figure 11:
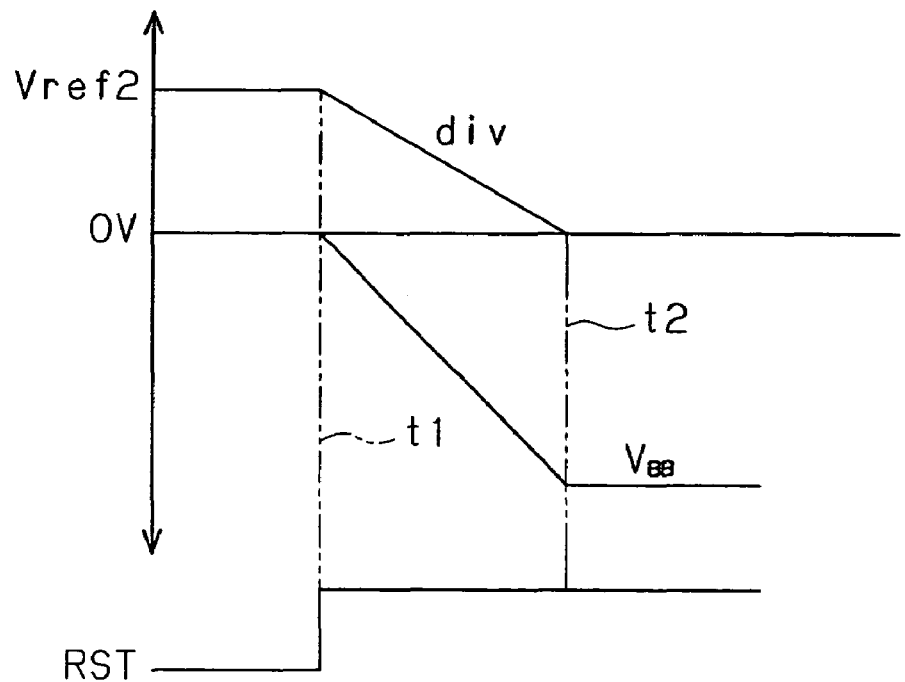
FIG. 11 is an operation waveform chart of the voltage detection circuit of FIG. 10.

FIG. 10 shows a voltage detection circuit 17c of the present embodiment, and FIG. 11 shows an operation waveform chart of the voltage detection circuit 17c.

The voltage detection circuit 17c, which is a circuit for detecting negative voltage $V_{BB}$ generated by the negative voltage generation section 20, and includes capacitors C1 and C2, a comparator 21 and a PMOS transistor Tp1. The negative voltage $V_{BB}$ is divided by capacitors C1 and C2, and the division voltage div is supplied to the comparator 21. The comparator 21 compares the division voltage div with a first reference voltage Vref1 to generate an output signal COM according to the comparison result.

The drain of the PMOS transistor Tp1 is connected to the node N1 of the capacitor C1 and C2. Second reference voltage Vref2 is supplied to the source of the PMOS transistor Tp1. The reset signal RST is provided to the gate of the PMOS transistor Tp1.

In the fourth embodiment, the first reference voltage Vref1 supplied to the comparator 21 is, for example, 0 V, and the second reference voltage Vref2 supplied to the source of the PMOS transistor Tp1 is, for example, 1.3 V. That is, the voltage detection circuit 17c starts the voltage detection operation when the division voltage div at the node N1 has a potential (1.3 V) higher than the ground potential (0 V).

More specifically, as shown in FIG. 11, when detection of the negative voltage $V_{BB}$ is started, the reset signal RST provided to the gate of the PMOS transistor Tp1 has a low level. The PMOS transistor Tp1 is activated by the reset signal RST, and the division voltage div of the capacitors C1 and C2 is initialized at a second reference voltage Vref2 (1.3 V).

At time t1, the reset signal RST shifts to a high level, and the PMOS transistor Tp1 is inactivated by the reset signal RST. Thus, the node N1 of the capacitors C1 and C2 enters a floating state. In this state, the negative voltage generation section 20 of the voltage generation circuit 18 is activated, and the value of the negative voltage $V_{BB}$ gradually changes to the negative side. Thus, the division voltage div of the capacitors C1 and C2 also changes in accordance with the negative voltage $V_{BB}$.

At time t2, when the negative voltage $V_{BB}$ reaches the target voltage value (e.g., −10 V) and the division voltage div decreases to the first reference voltage Vref1 (0 V), the output signal COM of the comparator 21 shifts from a low level to a high level. The negative voltage generation section 20 is controlled so that the negative voltage $V_{BB}$ of the negative voltage generation section 20 becomes equal to a desired voltage value (e.g., −10 V) in accordance with the output signal COM.

The voltage detection circuit 17c of the fourth embodiment has the advantages described below.

(1) The PMOS transistor Tp1 is used as a device for initializing the division voltage div of the capacitors C1 and C2. Thus, the off leak current is reduced by about 1/10 compared to when using the NMOS transistor. Accordingly, fluctuation of the division voltage div is suppressed, and voltage detection with the voltage detection circuit 17c is accurately performed.

A fifth embodiment of the present invention will now be described with reference to the drawings.

Figure 12:
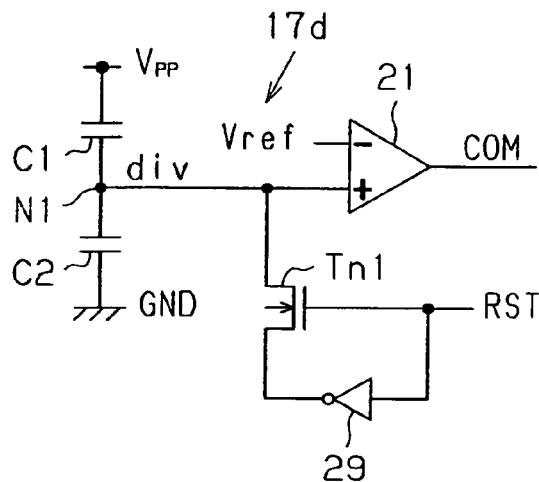
FIG. 12 is a circuit diagram of a voltage detection circuit according to a fifth embodiment of the present invention.

FIG. 12 shows a voltage detection circuit 17d of the fifth embodiment.

The voltage detection circuit 17d, which is a circuit for detecting the high voltage $V_{PP}$ generated in the high voltage generation section 19, includes capacitors C1 and C2, a comparator 21, an NMOS transistor Tn1, and a CMOS inverter circuit 29.

The high voltage $V_{PP}$ is divided by capacitors C1 and C2, and the division voltage div is supplied to the comparator 21. The comparator 21 compares the division voltage and the reference voltage Vref (1.3 V), and generates the output signal COM of the potential level according to the comparison result.

The drain of the NMOS transistor Tn1 is connected to the node N1 of the capacitors C1 and C2. The gate of the NMOS transistor Tn1 is electrically connected to the source of the NMOS transistor Tn1 via the inverter circuit 29.

The reset signal RST is provided to the gate of the NMOS transistor Tn1, and the reset signal RST is inverted and provided to the source of the NMOS transistor Tn1 via the inverter circuit 29. The amplitude of the output signal of the inverter circuit 29 is, for example, 1.8 V (high level 1.8 V, low level=0 V).

When starting detection of the high voltage $V_{PP}$, the NMOS transistor Tn1 is activated by the reset signal RST having a high level. In this state, the output signal of the inverter circuit 29 has a low level (ground potential=0 V). Thus, the division voltage div is initialized to ground potential.

Subsequently, the NMOS transistor Tn1 is inactivated by the low reset signal RST, and the division voltage div is changed in accordance with high voltage $V_{PP}$. In this state, the output signal of the inverter circuit 29 is shifted to a high level (1.8 V), and the high signal is provided to the source of the NMOS transistor Tn1. Thus, the voltage applied between the source and drain of the NMOS transistor Tn1 is decreased, and off leak current at the transistor Tn1 is decreased.

The advantages of the voltage detection circuit 17d in the fifth embodiment of the present invention will now be described.

(1) When the NMOS transistor Tn1 is inactivated after the division voltage div is reset, voltage higher than the division voltage div is supplied to the source of the transistor Tn1. This decreases off leak current at the transistor Tn1. Thus, voltage detection by the voltage detection circuit 17d is accurately performed.

It should be apparent to those skilled in the art that the present invention may be embodied in many other specific forms without departing from the spirit or scope of the invention. Particularly, it should be understood that the present invention may be embodied in the following forms.

In the voltage detection circuits 17 and 17a of the first and second embodiments, two transistors Tn1 and Tn2 are connected in series to the node N1 of the capacitors C1 and C2 (two-stage configuration). However, more transistors may be connected in series to form a multiple-stage configuration. In such a voltage detection circuit, the transistors are sequentially inactivated from the side of the ground GND. When there are multiple stages of transistors, the leak current decreases. However, resetting of the division voltage div to the ground potential is delayed. Thus, the number of transistors is set taking into consideration such delay.

In the voltage detection circuit 17a of the second embodiment, the NMOS transistor Tn3 may be replaced by a PMOS transistor. In this case, the reset signal RSTA is used as the control signal provided to the gate of the PMOS transistor.

In the fifth embodiment, when the NMOS transistor Tn1 is inactivated, voltage equal to the division voltage div may be supplied to the source of the NMOS transistor Tn1 in place of the voltage that is higher than the division voltage div.

In each of the above embodiments, the present invention is embodied in the semiconductor memory device (non-volatile memory) 11 including the memory cell array 13, which functions as a memory unit. However, the present invention may be embodied in a semiconductor device that does not including the memory cell array 13. Needless to say, the present invention may also be applied to semiconductor memory devices other than non-volatile memories, such as a DRAM.

The present examples and embodiments are to be considered as illustrative and not restrictive, and the invention is not to be limited to the details given herein, but may be modified within the scope and equivalence of the appended claims.

What is claimed is:

1. A voltage detection circuit for use with a voltage generation circuit to detect output voltage of the voltage generation circuit, the voltage detection circuit comprising:
   a first capacitor and a second capacitor, connected in series, for receiving the output voltage to generate a division voltage in accordance with the output voltage;
   a first transistor connected to a first node between the first capacitor and the second capacitor;
   a second transistor connected in series to the first transistor, the first and second transistors being activated to initialize potential at the first node to an initial potential; and
   a control circuit, connected to the first transistor, for generating a first control signal to inactivate the first transistor later than the second transistor and after the initialization of the potential at the first node.

2. The voltage detection circuit according to claim 1, wherein the control circuit generates the first control signal after the second transistor is inactivated and when the potential at the first node reaches a predetermined potential in accordance with the output voltage.

3. The voltage detection circuit according to claim 1, further comprising:
   a determination circuit for determining if the output voltage has reached the predetermined voltage by comparing the division voltage with a reference voltage, the control circuit generating the first control signal in accordance with a second control signal for controlling the second transistor and an output signal of the determination circuit.

4. The voltage detection circuit according to claim 1, further comprising:
   a third capacitor connected between ground and a second node between the first transistor and the second transistor;
   a third transistor connected to the first node; and
   a fourth capacitor connected between the third transistor and ground.

5. The voltage detection circuit according to claim 4, wherein the control circuit generates an inverted signal of the first control signal and provides the inverted signal to the third transistor.

6. The voltage detection circuit according to claim 4, wherein the third capacitor and the fourth capacitor have the same capacitance.

7. A semiconductor device comprising:
   a voltage generation circuit; and
   a voltage detection circuit for detecting output voltage of the voltage generation circuit, the voltage detection circuit including:
   a first capacitor and a second capacitor, connected in series, for receiving the output voltage to generate a division voltage in accordance with the output voltage;
   a first transistor connected to a first node between the first capacitor and the second capacitor;
   a second transistor connected in series to the first transistor, the first and second transistors being activated to initialize potential at the first node to an initial potential; and
   a control circuit, connected to the first transistor, for generating a first control signal to inactivate the first transistor later than the second transistor and after the initialization of the potential at the first node.

8. The semiconductor device according to claim 7, further comprising:
   a storage circuit for storing data, wherein the storage circuit writes or erases data using voltage generated by the voltage generation circuit.

9. The semiconductor device according to claim 8, wherein the storage circuit includes a non-volatile memory cell.

10. A method for controlling a voltage detection circuit, arranged in a semiconductor device including a voltage generation circuit, for detecting voltage generated by the voltage generation circuit, the voltage detection circuit including a first capacitor and a second capacitor, connected in series, a first transistor connected to a first node between the first capacitor and the second capacitor, and a second transistor connected in series to the first transistor, the method comprising:
   generating a division voltage in accordance with an output voltage of the voltage generation circuit using the first and second capacitors;
   activating the first transistor and the second transistor to initialize potential at the first node to an initial potential;
   inactivating only the second transistor after the potential at the first node is initialized and equalizing the potential at a second node between the first transistor and the second transistor with the potential at the first node; and
   inactivating the first transistor when the potential at the first node reaches a predetermined potential in accordance with the output voltage of the voltage generation circuit.

11. The method according to claim 10, further comprising:
   determining whether the output voltage of the voltage generation circuit has reached a target voltage value by comparing the division voltage by the first capacitor and the second capacitor with a reference voltage, wherein the step of inactivating the first transistor includes inactivating the first transistor in accordance with the determination.

12. The method according to claim 10, wherein the voltage detection circuit further includes a third capacitor connected to the second node, a third transistor connected to the first node, and a fourth capacitor connected to the third transistor, the method further comprising:
   electrically disconnecting the third capacitor from the first node by inactivating the first transistor; and
   electrically connecting the fourth capacitor to the first node in place of the disconnected third capacitor by activating the third transistor.

* * * * *